(12) United States Patent
Wicpalek et al.

(10) Patent No.: US 8,098,104 B2
(45) Date of Patent: Jan. 17, 2012

(54) ESTIMATION AND COMPENSATION OF OSCILLATOR NONLINEARITIES

(75) Inventors: Christian Wicpalek, Linz (AT); Thomas Mayer, Linz (AT); Thomas Bauernfeind, Arbing (AT); Volker Neubauer, Linz (AT); Linus Maurer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 72 days.

(21) Appl. No.: 12/578,105

(22) Filed: Oct. 13, 2009

(65) Prior Publication Data
US 2011/0084769 A1    Apr. 14, 2011

(51) Int. Cl.
*G01R 23/00* (2006.01)
*H03L 7/00* (2006.01)
(52) U.S. Cl. ............. 331/17; 331/11; 331/16; 331/44
(58) Field of Classification Search ........... 331/10, 331/11, 14, 16–18, 25, 34, 44, 175
See application file for complete search history.

(56) References Cited

U.S. PATENT DOCUMENTS
6,353,348 B1 * 3/2002 Blaser ................ 327/156

OTHER PUBLICATIONS

Nicola Da Dalt et al., A 10b 10GHz Digitally Controlled LC Oscillator in 65nm CMOS, ISSCC 2006/ Session 10/mm-Wave and Beyond /10.5, Feb. 7, 2006, pp. 188-190, 2006 IEEE International Solid-State Circuits Conference.
Christian Mayer et al. A Robust GSM/EDGE Transmitter Using Polar Modulation Techniques, Oct. 3-4, 2005, 93-96, The European Conference on Wireless Technology, 2005, Paris, France.
T. Pittorino et al., A UMTS-Compliant Fully Digitally Controlled Oscillator with 100Mhz Fine-Tuning Range in O.131μm CMOS, Feb. 7, 2006, pp. 210-212, 2006 IEEE International Solid-State Circuits Conference.

* cited by examiner

*Primary Examiner* — David Mis
(74) *Attorney, Agent, or Firm* — SpryIP, LLC

(57) ABSTRACT

A device may include an oscillator circuit, a control circuit, a frequency detector circuit, and a processor circuit. The oscillator circuit may include a frequency control input to output an oscillator signal. The frequency of the oscillator signal depends on an input signal applied to the frequency control input. The control circuit is configured to apply a first input signal value, a second input signal value, and a third input signal value to the frequency control input. The frequency detector circuit is configured to detect the first frequency value of the oscillator signal when the first input signal value is applied to the frequency control input, a second frequency value of the oscillator signal when the second input signal value is applied to the frequency control input, and a third frequency value of the oscillator signal when the third input signal value is applied to the frequency control input.

22 Claims, 17 Drawing Sheets

ESTIMATION AND COMPENSATION OF OSCILLATOR NONLINEARITIES

FIELD OF THE INVENTION

The present invention relates to devices and methods which allow for estimating and/or compensating nonlinearities of an oscillator circuit.

BACKGROUND OF THE INVENTION

Oscillator circuits are used in a variety of applications. For example, an oscillator circuit may be part of a phase locked loop (PLL). PLLs may be used, e.g., for frequency modulation radio devices or mobile communication devices. In mobile communication devices, such as mobile phones or the like, a PLL may be used for modulation, demodulation, clock recovery, and/or radio frequency synthesis. These and other applications benefit from a good linearity of the oscillator circuit, i.e. a good linearity of an oscillator characteristic relating values of an input signal applied to a frequency control input of the oscillator circuit to values of the frequency of the oscillator signal produced by the oscillator circuit.

In practice, the oscillator characteristic is determined by the implementation of the oscillator circuit and will typically show certain nonlinearities. Accordingly, there is a need for sufficient techniques which allow for estimating and/or compensating these nonlinearities.

SUMMARY OF THE INVENTION

According to an embodiment of the invention, a device is provided which comprises an oscillator circuit, a control circuit, a frequency detector circuit, and a processor circuit. The oscillator circuit comprises a frequency control input and is configured to output an oscillator signal. A frequency of the oscillator signal depends on an input signal applied to the frequency control input. The control circuit is configured to apply a first input signal value, a second input signal value, and a third input signal value to the frequency control input. The frequency detector circuit is configured to detect a first frequency value of the oscillator signal when the first input signal value is applied to the frequency control input, a second frequency value of the oscillator signal when the second input signal value is applied to the frequency control input, and a third frequency value of the oscillator signal when the third input signal value is applied to the frequency control input. The processor circuit is configured to calculate, on the basis of the first input signal value, the second input signal value, the third input signal value, the first frequency value, the second frequency value, and the third frequency value, a second order coefficient of a polynomial oscillator characteristic relating values of the frequency of the oscillator signal to values of the input signal.

According to a further embodiment, a device is provided which comprises an equalizer circuit and an oscillator circuit. The equalizer circuit is configured to receive a frequency control signal and to output an equalized frequency control signal. The oscillator circuit comprises a frequency control input and is configured to output an oscillator signal. A frequency of the oscillator signal depends on an input signal applied to the frequency control input. The frequency control input of the oscillator circuit is coupled to the equalizer circuit so as to receive the equalized frequency control signal. The equalizer circuit is provided with a nonlinear equalizer characteristic relating values of the frequency control signal to values of the equalized frequency control signal. The equalizer characteristic is configured to compensate nonlinearities of an oscillator characteristic relating values of the frequency of the oscillator signal to values of the input signal.

According to other embodiments, further devices and/or methods may be provided. Features of such embodiments will be apparent from the following detailed description and the accompanying drawings.

DETAILED DESCRIPTION OF EMBODIMENTS

In the following, embodiments of the invention will be explained in more detail and with reference to the accompanying drawings. It is to be understood that the description is not to be taken in a limiting sense, but is made only for the purpose of illustrating the general principles of the invention. Further, it is to be understood that the scope of the invention is only defined by the claims and is not intended to be limited by the embodiments and examples described hereinafter.

Throughout the description and the drawings, similar or corresponding components are designated by the same reference signs. Here, it is to be understood that the described and illustrated structures are merely illustrative and schematic and that any shown or described direct connection or coupling between two functional blocks, entities, devices, components, or other physical or functional elements could also be implemented by indirect connection or coupling. Further, it is to be understood that some components of the illustrated embodiments may be implemented by dedicated hardware or by software to be executed by a processor.

The embodiments as described hereinafter relate to techniques which allow for estimating and/or compensating nonlinearities of an oscillator characteristic. These techniques may be used in connection with various types of oscillator circuits generating an oscillator signal having a frequency depending on an input signal applied to a frequency control input of the oscillator circuit, e.g. in voltage controlled oscillators or in digitally controlled oscillators. Only for the purpose of illustration, the following description will refer to examples using a digitally controlled oscillator and to applications in which a digitally controlled oscillator is used in a PLL.

Figure 1:
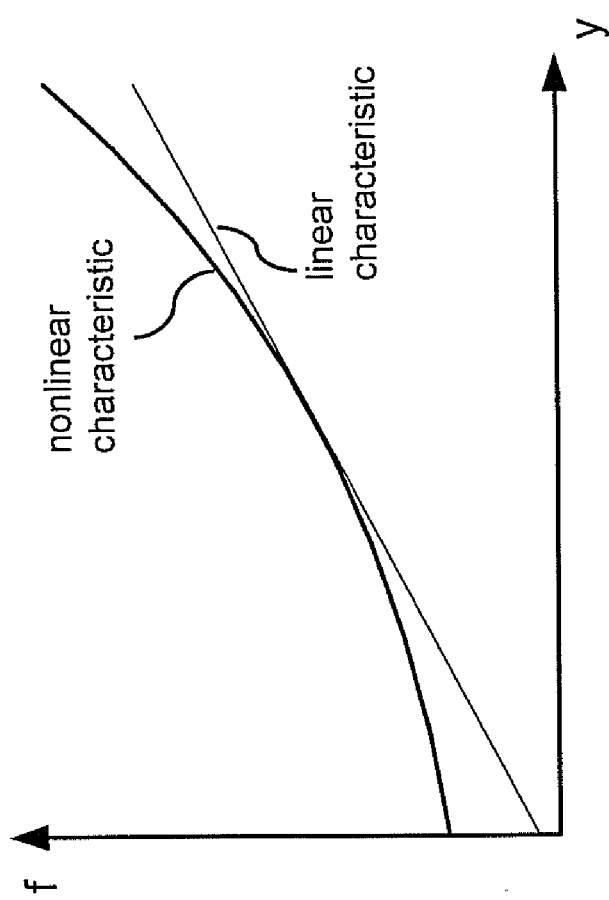
FIG. 1 schematically illustrates a nonlinear characteristic of an oscillator circuit.

In one example, an oscillator circuit may be implemented using switchable capacitors which are connected in parallel to a fixed inductance and capacitance. According to a simplified model, the oscillator characteristic of such an oscillator circuit can be written as:

$$f(y) = \frac{1}{2\pi\sqrt{L(C_{FIX} + (N_{VAR} - 1 - y)C_{VAR})}}, \quad (1)$$

where f describes the frequency of the oscillator signal, L a fixed inductance, $C_{FIX}$ a fixed capacitance determining a base frequency, $N_{VAR}$ a number of switchable unit capacitors, $C_{VAR}$ a switchable unit capacitance of the switchable unit capacitors, and y a digital input signal. The input signal y determines how many of the switchable unit capacitors are switched on. A tuning range of the oscillator circuit extends between y=0 and y=$N_{VAR}$−1. The resulting nonlinear oscillator characteristic is schematically illustrated in FIG. 1 (thick line). For comparison, FIG. 1 also shows an ideal linear oscillator characteristic (thin line).

In the region around a reference point $y_0$, e.g. centered in the tuning range of the oscillator circuit, a nonlinear oscillator characteristic, such as illustrated in FIG. 1, can be approximated by an n-th order polynomial given by:

$$f(y) = a_0 + a_1(y-y_0) + a_2(y-y_0)^2 \ldots + a_n(y-y_0)^n. \quad (2)$$

In equation (2), y denotes the input signal applied to the frequency control input of the oscillator circuit. The coefficient $a_0$ corresponds to a constant base frequency and the coefficient $a_1$ corresponds to an average gain. The coefficient $a_2$ and higher order coefficients $a_n$ with n≧3 correspond to non-linearities of the oscillator characteristic.

According to some embodiments of the present invention, nonlinearities of the oscillator characteristic are estimated by determining coefficients of the n-th order polynomial approximating the oscillator characteristic, e.g. the second order coefficient $a_2$, the third order coefficient $a_3$. Other coefficients may be estimated as well, e.g. the first order coefficient $a_1$ or higher order coefficients $a_n$ with n>3.

According to some embodiments, the coefficients may be used as a basis for compensating the nonlinearities of the oscillator characteristic. For example, the first order coefficient $a_1$ and/or the second order coefficient $a_2$ may be used as a basis for correcting a gain value of a loop filter provided in a control loop for generating a frequency control signal $y_c$.

For example, the gain may be corrected by multiplication with a gain correction factor given by:

$$k_{cor}(y_C) = \frac{1}{1 + 2 \cdot a_{2N}(y_C - y_0)}, \quad (3)$$

where $a_{2N}$ denotes a normalized second order polynomial coefficient given by $a_2/a_1$, and $y_0$ may be centered in the tuning range of the oscillator circuit, e.g. correspond to $N_{VAR}$/2 when assuming an oscillator characteristic as given by equation (1). That is to say, the gain correction factor $k_{cor}$ depends on the value of the frequency control signal $y_c$.

According to some embodiments of the invention, an equalizer circuit may be used for compensating the nonlinearities of the oscillator circuit. The equalizer circuit receives a frequency control signal $y_c$ and generates an equalized frequency control signal $y_E$ therefrom. The equalizer circuit is provided with an equalizer characteristic relating values of the frequency control signal to values of the equalized control signal. According to an embodiment of the invention, the equalizer characteristic is a nonlinear characteristic determined to approximate the inverse oscillator characteristic:

$$g(y) \approx f^{-1}(y \cdot k) = b_0 + b_1(y-y_0) + b_2(y-y_0)^2 \ldots + b_n(y-y_0)^n, \quad (4)$$

where $b_0, b_1, b_2, \ldots b_n$ represent coefficients of a polynomial approximation of the equalizer characteristic.

According to some embodiments of the invention, compensating nonlinearities is accomplished by calculating the equalized frequency control signal $y_E$ according to:

$$y_E = y_C + b_2(y_C - y_0)^2. \quad (5)$$

A first order Taylor series approximation of equation (3) results in:

$$k_{cor}(y_C) \approx 1 - 2 \cdot a_{2N}(y_C - y_0). \quad (6)$$

Since the gain correction factor of equation (3) is applied to the loop filter gain, whereas equation (5) is applied directly to the frequency control signal, these equations are related to each other by a differentiation operation. Differentiating equation (5) yields:

$$\frac{dy_E}{dy_C} = \frac{d}{dy_C}(y_C + b_2(y_C - y_0)^2) = 1 + 2 \cdot b_2(y_C - y_0). \quad (7)$$

A comparison of equations (7) and (6) shows that $$b_2 = -a_{2N}, \quad (8)$$

i.e. that the second order polynomial coefficient of the equalizer characteristic is equal to the negative value of the normalized second order polynomial coefficient of the oscillator characteristic.

Figure 2:
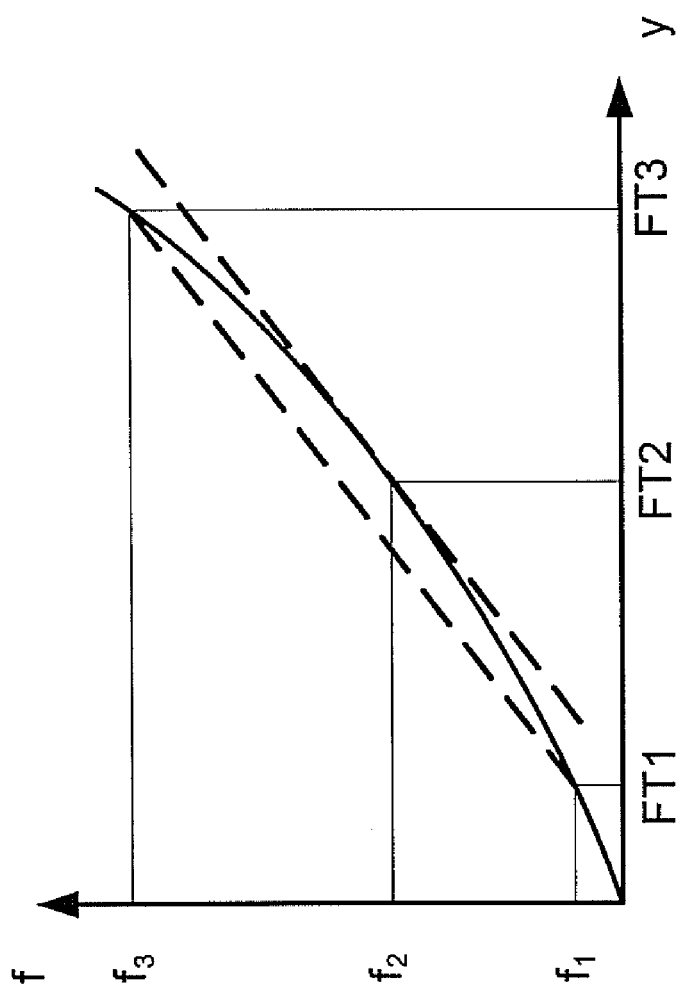
FIG. 2 schematically illustrates frequency measurement points in a nonlinear oscillator characteristic.

In the following, a process of determining polynomial coefficients of the oscillator characteristic will be described in more detail. According to this process, three frequency measurements are performed at different input signal values applied to the frequency control input of the oscillator circuit. In the following, a first input signal value will be denoted by FT1, a second input signal value will be denoted by FT2, and a third input signal value will be denoted by FT3. A first frequency value, denoted by $f_1$, is measured when the first input signal value FT1 is applied to the frequency control input, a second frequency value $f_2$ is measured when the second input signal value FT2 is applied to the frequency control input, and a third frequency value $f_3$ is measured when the third input signal value FT3 is applied to the frequency control input. These three measurement points are schematically illustrated in FIG. 2.

According to an embodiment of the invention, FT1 may be selected to be at the lower end of the tuning range of the oscillator circuit, FT2 may be selected to be approximately at the center of the tuning range of the oscillator circuit, and FT3 may be selected to be at the upper end of the tuning range of the oscillator circuit. According to the specific example as discussed in the following, the input signal values FT1, FT2, and FT3 may be selected so as to satisfy the following relations:

$$FT2 = \frac{(FT1 + FT3)}{2} \text{ and} \quad (9)$$

$$\Delta FT = FT3 - FT1 \quad (10)$$

Applying the results of the three frequency measurements to equation (2) results in a system of three equations:

$$f_1 = a_0 + a_1(FT1-y_0) + a_2(FT1-y_0)^2, \quad (11)$$

$$f_2 = a_0 + a_1(FT2-y_0) + a_2(FT2-y_0)^2, \text{ and} \quad (12)$$

$$f_3 = a_0 + a_1(FT3-y_0) + a_2(FT3-y_0)^2. \quad (13)$$

Solving equations (11)-(13) yields $$a_2 = \frac{f_1(FT3-FT2) + f_2(FT1-FT3) + f_3(FT2-FT1)}{(FT3-FT2)FT1^2 + (FT1-FT3)FT2^2 + (FT2-FT1)FT3^2}. \quad (14)$$

The coefficients $a_0$ and/or $a_1$ may be solved from equations (11)-(13) as well. According to some embodiments of the invention, the coefficient $a_1$ is estimated from two frequency measurements, e.g. from the frequency measurements of $f_3$ and $f_1$ according to:

$$a_1 = \frac{f_3 - f_1}{FT3 - FT1}. \quad (15)$$

When selecting the input signal values for the frequency measurements according to equation (9), the normalized second coefficient $a_{2N}$ can be calculated according to $$a_{2N} = \frac{a_2}{a_1} = \frac{2 \cdot (f_3 - 2f_2 + f_1)}{(FT3-FT1) \cdot (f_3 - f_1)}. \quad (16)$$

According to some embodiments of the invention, higher order polynomial coefficients of the oscillator characteristic may be calculated on the basis of a respective number of frequency measurements. According to an embodiment of the invention, the n-th order coefficient $a_n$ of the oscillator characteristic is calculated on the basis of n+1 frequency measurements. That is to say, n+1 different input signal values are applied to the frequency control input of the oscillator circuit, and n+1 frequency values of the oscillator signal are detected. Each of the detected frequency values corresponds to a respective one of the input signal values.

According to an embodiment of the invention, a third order polynomial coefficient $a_3$ of the oscillator characteristic is determined on the basis of four frequency measurements, i.e. a frequency $f_1$ measured when an input signal value FT1 is applied to the frequency control input, a second frequency value $f_2$ measured when a second input signal value FT2 is applied to the frequency control input, a third frequency value $f_3$ measured when a third input signal value FT3 is applied to the frequency control input, and a fourth frequency value $f_4$ measured when a fourth input signal value FT4 is applied to the frequency control input. Applying the results of the four frequency measurements to equation (2) results in a system of four equations:

$$f_1 = a_0 + a_1(FT1-y_0) + a_2(FT1-y_0)^2 + a_3(FT1-y_0)^3, \quad (17)$$

$$f_2 = a_0 + a_1(FT2-y_0) + a_2(FT2-y_0)^2 + a_3(FT2-y_0)^3, \quad (18)$$

$$f_3 = a_0 + a_1(FT3-y_0) + a_2(FT3-y_0)^2 + a_3(FT3-y_0)^3, \text{ and} \quad (19)$$

$$f_4 = a_0 + a_1(FT4-y_0) + a_2(FT4-y_0)^2 + a_3(FT4-y_0)^3. \quad (20)$$

Solving these equations shows that the third order polynomial coefficient $a_3$ can be calculated according to $$a_3 = 2 \frac{\begin{array}{c} f_1(FT1+FT3-2FT4)(FT3-FT4) + \\ 4f_2(FT4-FT3)(FT1-FT4) \end{array}}{(FT1-FT3)^2(FT1+FT3-2FT4)} + \frac{}{(FT1-FT4)(FT3-FT4)}$$

$$2\frac{f_3(FT1+FT3-2FT4)(FT1-FT4) - f_4(FT1-FT3)^2}{(FT1-FT3)^2(FT1+FT3-2FT4)}.$$
$$(FT1-FT4)(FT3-FT4)$$
$$(21)$$

As can be seen from equations (14), (15), (16), and (21), each of the polynomial coefficients $a_1$, $a_2$, $a_{2N}$, and $a_3$ can be calculated on the basis of a single division operation. In addition, add operations and multiplication operations are used. Some of the add or multiplication operations may be avoided or simplified by appropriately selecting the input signal values used in the frequency measurements. One example of such a selection is given by equation (9), which has been shown to simplify the calculation of the second order polynomial coefficient $a_2$ and the normalized second order coefficient $a_{2N}$.

According to the above embodiments, knowledge of the oscillator characteristic is provided by performing a number of frequency measurements. The evaluation of the results of the frequency measurements involves only a limited number of complex mathematical operations, in particular only a single division operation. The process of determining the polynomial coefficients of the oscillator characteristic can therefore be efficiently implemented by means of digital signal processing elements. As an alternative, the process may also be implemented by a programmable multi-purpose processor.

Knowledge of the oscillator characteristic, in particular of nonlinearities as represented by the second order polynomial coefficient or higher order coefficients, in turn may be used as a basis for compensating the nonlinearities. According to some embodiments of the invention, the second order polynomial coefficient may be used in a gain compensation-algorithm operating according to equation (3) or in an equalizer circuit operating according to equation (5).

According to some embodiments, the above concepts are used for estimating nonlinearities of an oscillator circuit in a PLL. In such cases, estimation and compensation of the nonlinearities allows for obtaining a PLL gain characteristic which is substantially constant. Further, a desired PLL gain characteristic may be set so as to improve performance of the PLL with respect to error vector magnitude (EVM) or phase error. In addition, designing the PLL may be facilitated since the requirements to be met by individual elements of the PLL are less strict.

Figure 3:
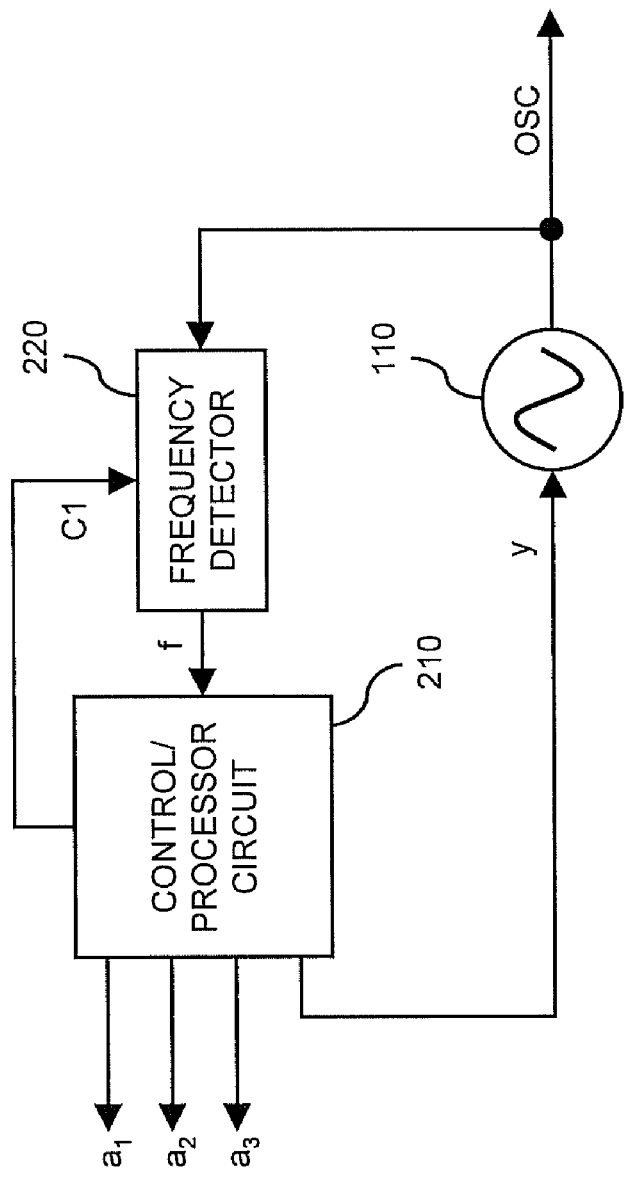
FIG. 3 schematically illustrates a circuit according to an embodiment of the invention.

FIG. 3 shows a circuit according to an embodiment of the invention. The circuit may be used for implementing a process of estimating nonlinearities as described above.

As illustrated, the circuit comprises an oscillator circuit 110. In the following description, it will be assumed that the oscillator circuit 110 is implemented as a digitally controlled oscillator. However, it is to be understood that other oscillator implementations, e.g. a voltage controlled oscillator, may be used as well.

The oscillator circuit 110 comprises a frequency control input receiving an input signal y and is configured to generate an oscillator signal OSC. The frequency of the oscillator signal OSC depends on the input signal y applied to the frequency control input of the oscillator circuit 110. An oscillator characteristic relates values of the frequency of the oscillator signal OSC to values of the input signal y.

In addition, the circuit comprises a control and processor circuit 210, in the following also referred to as processor circuit. The processor circuit 210 is configured to control frequency measurements and to apply a number of different input signal values to the frequency control input of the oscillator circuit 110. According to an embodiment of the invention, the number of different input signal values applied by the processor circuit 210 is at least 3. In addition, the processor circuit 210 is configured to calculate at least a second order polynomial coefficient of the equalizer characteristic on the basis of the frequency measurements, using the concepts as described above. Here, it is to be understood that also a separate control circuit for controlling the frequency measurements and a separate processor circuit for performing the coefficient calculations could be used. The processor circuit may be implemented by a programmable processor and/or by dedicated digital processing elements.

In addition, the circuit comprises a frequency detector circuit 220. The frequency detector circuit 220 is controlled by the processor circuit 210 using a control signal C1. The frequency detector circuit is configured to detect the frequency of the oscillator signal OSC. According to an embodiment of the invention, the frequency detector circuit 220 may comprise a counter which counts a number N of signal transitions occurring in a certain time interval or gating time, denoted by $T_G$. Assuming that the counter counts one signal transition per cycle of the oscillator signal OSC, the frequency of the oscillator signal is given by:

$$f = \frac{N}{T_G}. \quad (22)$$

According to some embodiments of the invention, frequency values, e.g. the frequency values $f_1$, $f_2$, $f_3$, or $f_4$ may be calculated from a measured counter value according to equation (22). According to some embodiments of the invention, the same value of $T_G$ is used for each frequency measurement, and the normalized second order polynomial coefficient $a_{2N}$ may also be calculated according to:

$$a_{2N} = \frac{2 \cdot (N_3 - 2N_2 + N_1)}{(FT3 - FT1) \cdot (N_3 - N_1)}, \quad (23)$$

where $N_1$ is the measured counter value when the first input signal value FT1 is applied to the frequency control input, $N_2$ is the measured counter value when the second input signal value FT2 is applied to the frequency control input, and $N_3$ is the measured counter value when the third input signal value is applied to the frequency control input. That is to say, the frequency values may also be measured in the form of counter values.

The operation of the circuit as illustrated in FIG. 3 is as follows: The processor circuit 210 applies the different input signal values to the frequency control input of the oscillator circuit 110, e.g. the signal values FT1, FT2, FT3, or FT4. At the same time, the processor circuit 210 controls the frequency detector 220 using the control signal C1. In particular, the frequency detector 220 is controlled to measure a respective frequency value for each of the different input signal values. The measured frequency values, e.g. the values $f_1$, $f_2$, $f_3$, or $f_4$, are supplied to the processor circuit 210. As mentioned above, the frequency values supplied to the processor circuit 210 may also be represented by counter values.

On the basis of the different input signal values and the corresponding frequency values determined by the frequency detector 220, the processor circuit 210 calculates polynomial coefficients of the oscillator characteristic. For example, the processor circuit may calculate the polynomial coefficients $a_1$, $a_2$, and/or $a_3$ according to equations (14), (15), (16), or (21). According to an embodiment of the invention, the second order polynomial coefficient is calculated as the normalized second order polynomial coefficient $a_{2N}$ according to equations (16) or (23).

Figure 4:
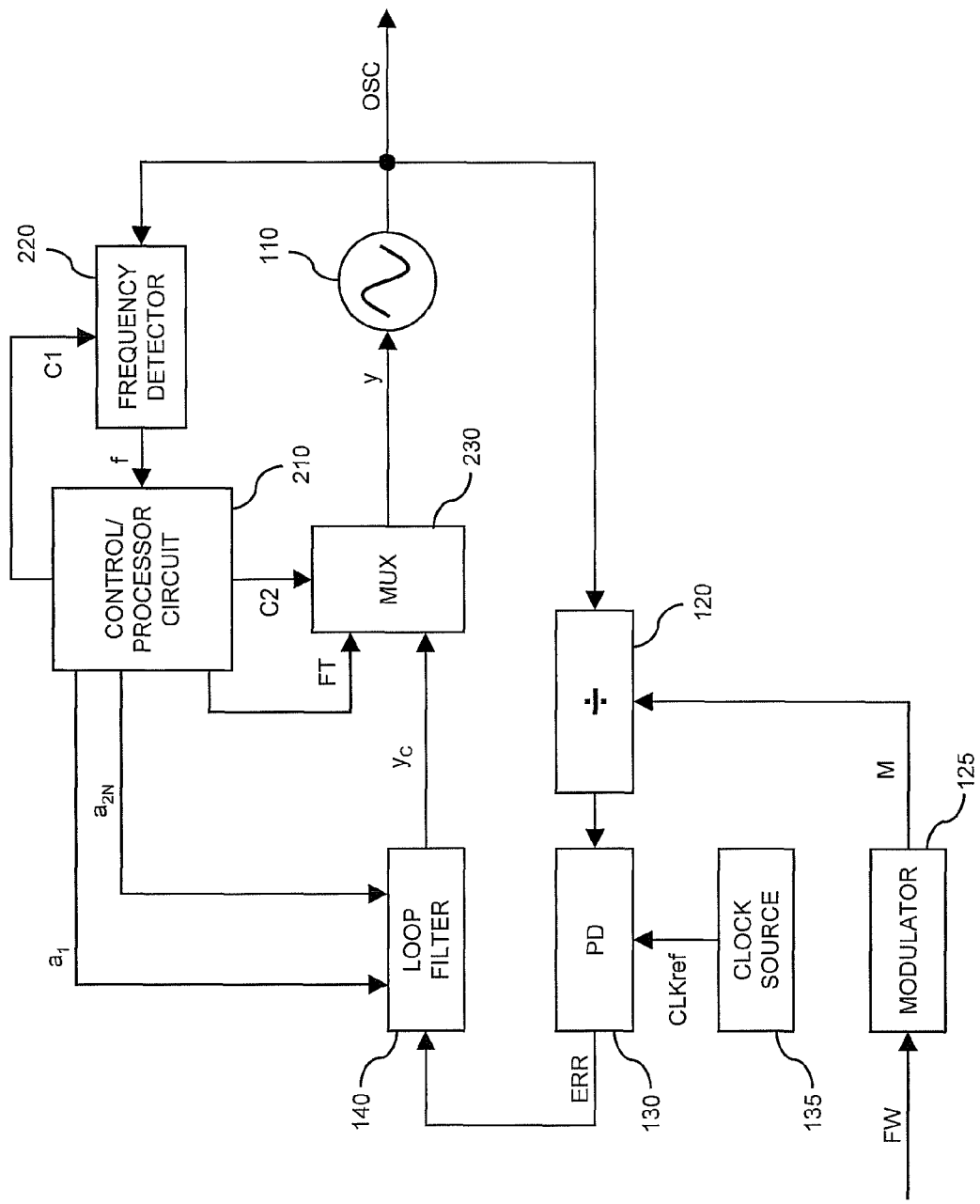
FIG. 4 schematically illustrates a circuit according to a further embodiment of the invention.

FIG. 4 shows a circuit according to a further embodiment of the invention. In the circuit of FIG. 4, components which are similar to those of FIG. 3 have been designated by the same reference signs. Specifically, the circuit of FIG. 4 comprises the oscillator circuit 110, the control and processor circuit 210, and the frequency detector 220 as well. Similar to the circuit of FIG. 3, the processor circuit 210 and the frequency detector circuit 220 are configured to estimate nonlinearities in the oscillator characteristic of the oscillator circuit 110. In the illustrated example, the first order polynomial coefficient $a_1$ and the normalized second order polynomial coefficient $a_{2N}$ are estimated. Details concerning the configuration of the processor circuit 210, the frequency detector 220, and the oscillator circuit 110 can be taken from the corresponding description in connection with FIG. 3.

In the circuit of FIG. 4, the oscillator circuit 110 is part of a PLL. The PLL comprises a control loop for generating a frequency control signal $y_c$ on the basis of the oscillator signal OSC output by the oscillator circuit 110. As illustrated, the control loop comprises a divider circuit 120 receiving the oscillator signal OSC and generating a divided oscillator signal. The divided oscillator signal has a frequency which corresponds to the frequency of the oscillator signal OSC divided by a frequency divisor M. In the illustrated example, the frequency divider circuit 120 is configured as a multi-modulus divider, i.e. is configured to operate on the basis of different values of the frequency divisor M.

The control loop further comprises a phase detector (PD) 130. The phase detector 130 receives the divided oscillator signal from the frequency divider circuit 120 and generates an error signal ERR on the basis of a comparison with respect to a reference clock signal CLKref. According to an embodiment of the invention, the phase detector 130 may be implemented on the basis of a time-to-digital converter. Accordingly, in some embodiments of the invention, the error signal ERR generated by the phase detector 130 may be a digital signal.

In addition, the control loop comprises a loop filter 140. The loop filter 140 receives the error signal ERR from the phase detector 130 and is configured to generate the frequency control signal $y_c$ by filtering the error signal ERR. According to an embodiment, the loop filter 140 comprises a digital low-pass filter. As illustrated, the loop filter 140 is supplied with the polynomial coefficients $a_1$ and $a_{2N}$ as estimated by the processor circuit 210. The first order polynomial coefficient $a_1$ is used for setting a loop filter gain. According to an embodiment of the invention, the loop filter gain is proportional to $1/a_1$, with gain correction on the basis cording to an embodiment of the invention, a gain correction is accomplished with the multiplicative correction factor of equation (3).

In the illustrated example, the circuit further comprises a digital modulator circuit 125, e.g. a MASH (Multiple-Stage Noise Shaping) modulator. The modulator circuit 125 receives a frequency word FW and is configured to generate the frequency divisor M on the basis of the frequency word FW. Due to the operation of the modulator circuit 125, the frequency divisor M is randomized, thereby improving phase-noise characteristics of the PLL.

In addition, the circuit comprises a clock source 135 configured to generate the reference clock signal CLKref. For example, the clock source 135 may comprise a fixed-frequency oscillator circuit.

In the illustrated example, the circuit additionally comprises a multiplexer 230 coupled between the loop filter 140 and the frequency control input of the oscillator circuit 110. The multiplexer 230 is configured to select between either supplying the frequency control signal $y_c$ as the input signal $y$ to the frequency control input or supplying the input signal values as provided by the processor circuit 210, in FIG. 4 denoted by FT, as the input signal $y$ to the frequency control input. The multiplexer 230 is controlled by a control signal C2 which is generated by the processor circuit 210. By means of the control signal C2, the processor circuit 210 may either select a closed-loop mode in which the frequency control signal $y_c$ is used as the input signal $y$ of the oscillator circuit 110, or an open-loop mode in which the input signal values FT provided by the processor circuit 210 are used as the input signal $y$ of the oscillator circuit 110. It is therefore possible to perform the above-mentioned frequency measurements for determining the oscillator characteristic in the open-loop mode.

Figure 5:
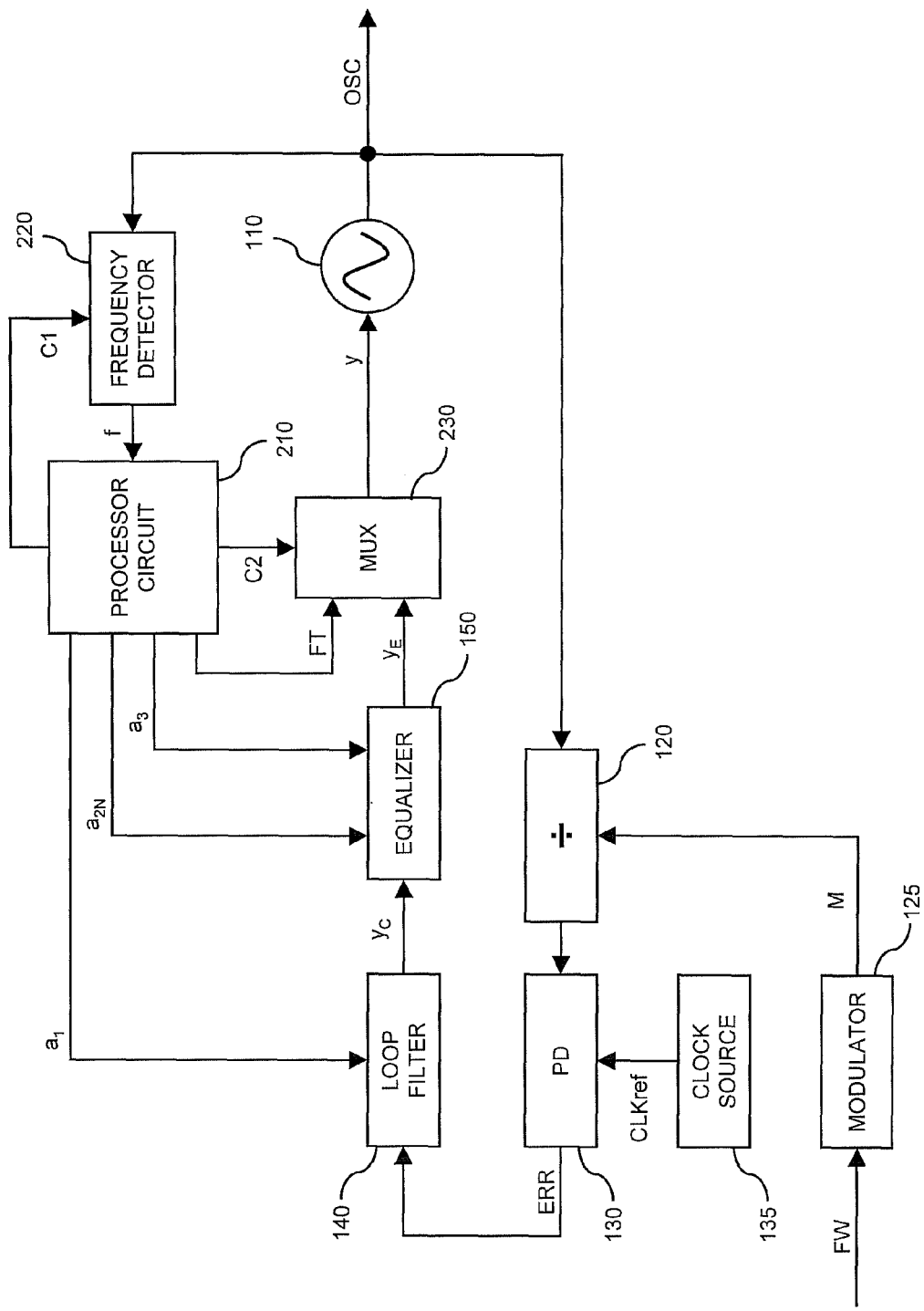
FIG. 5 schematically illustrates a circuit according to a further embodiment of the invention.

FIG. 5 shows a circuit according to a further embodiment of the invention. The circuit of FIG. 5 generally corresponds to the circuit of FIG. 4, and similar components have been designated by the same reference signs. Details concerning these components can be taken from the corresponding description in connection with FIG. 3 or 4.

As compared to the circuit of FIG. 4, the circuit of FIG. 5 is additionally provided with an equalizer circuit 150. In the illustrated example, the equalizer circuit 150 is coupled between the loop filter 140 and the frequency control input of the oscillator circuit 110. More specifically, the equalizer circuit 150 is coupled between the loop filter 140 and the multiplexer 230.

The equalizer circuit 150 receives the frequency control signal $y_c$ from the loop filter 140 and is configured to generate an equalized frequency control signal $y_E$ according to an equalizer characteristic relating values of the frequency control signal $y_c$ to values the equalized frequency control signal $y_E$. According to an embodiment of the invention, the equalizer characteristic is a nonlinear characteristic configured to compensate for the nonlinearities of the oscillator characteristic as determined by the processor circuit 210. The equalizer characteristic may be a polynomial characteristic as given by equation (4), and polynomial coefficients of the equalizer characteristic may be determined on the basis of at least the second order polynomial coefficient $a_2$ of the oscillator characteristic. For example, the second order polynomial coefficient $b_2$ of the equalizer characteristic may be selected to correspond to the negative value of the normalized second order coefficient $a_{2N}$.

As illustrated, the equalizer characteristic may also be selected or adjusted on the basis of the third order polynomial coefficient $a_3$ of the oscillator characteristic. According to further embodiments of the invention, the second order polynomial coefficient $a_2$ without normalization or higher order polynomial coefficients $a_n$ with $n>3$ may be used as well to select or adjust the equalizer characteristic.

According to an embodiment of the invention, the equalizer circuit comprises a look-up table configured to store values of the frequency control signal $y_c$ and related values of the equalized frequency control signal $y_E$. According to a further embodiment of the invention, the equalizer circuit comprises a calculator circuit configured to perform at least one mathematical operation on the frequency control signal $y_c$ so as to obtain the related values of the equalized frequency control signal $y_E$, e.g. a squaring operation, an addition operation and/or a multiplication operation. According to some embodiments of the invention, also a combination of a look-up table and a calculator circuit may be used to implement the equalizer circuit 150.

In the circuit of FIG. 5, nonlinearities of the oscillator characteristic are compensated by the equalizer circuit 150. Accordingly, no gain correction on the basis of the second order polynomial coefficient $a_{2N}$ is needed in the loop filter 140. In the circuit of FIG. 5, the loop filter gain may be set on the basis of the first order coefficient $a_1$ only, i.e. so as to correspond to $1/a_1$. However, in some embodiments nonlinearities may be compensated both by gain compensation in the loop filter 140, i.e. on the basis of the normalized second order polynomial coefficient $a_{2N}$ as explained in connection with FIG. 4, and in the equalizer circuit 150, e.g. on the basis of higher order polynomial coefficients $a_n$ with $n \geq 3$.

Figure 6:
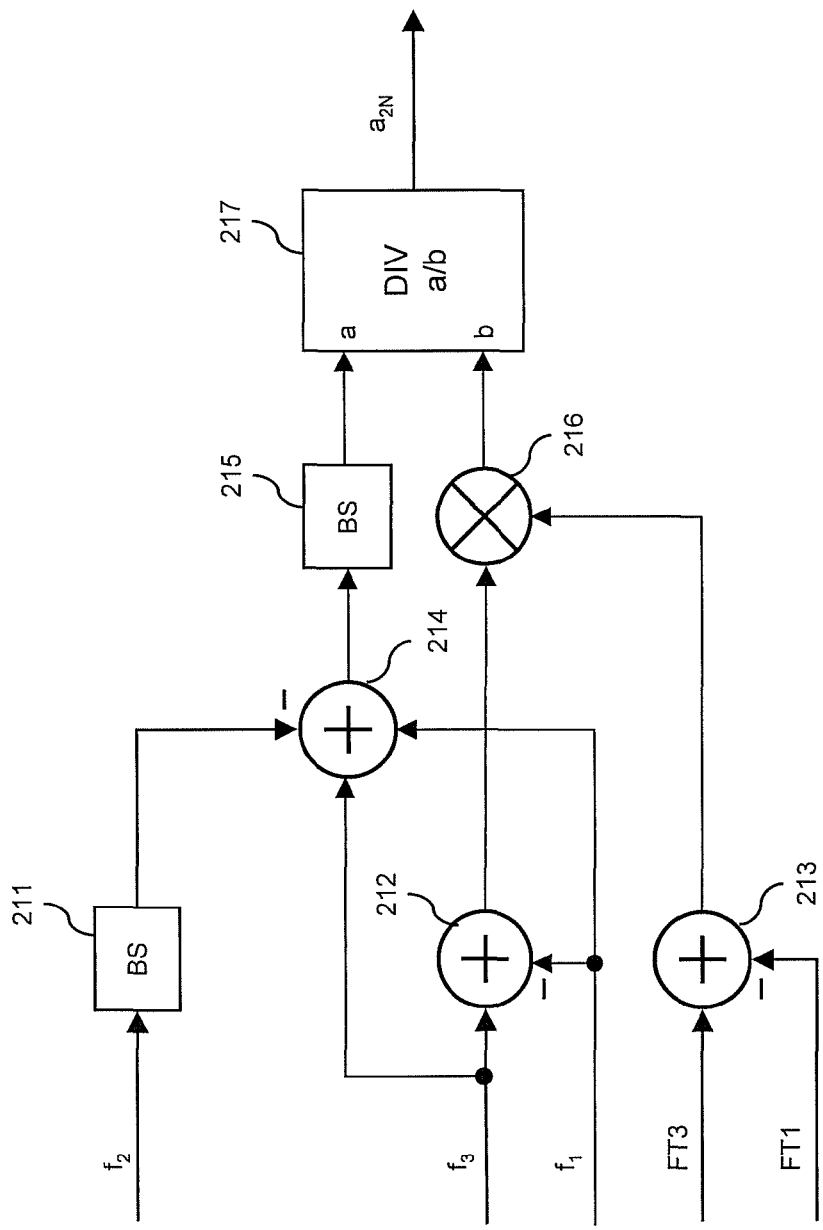
FIG. 6 schematically illustrates a calculation circuit according to an embodiment of the invention.

FIG. 6 schematically illustrates a circuit according to an embodiment of the invention, which may be used to implement the calculation of the normalized second order polynomial coefficient $a_{2N}$ according to equation (16). That is to say, the circuit of FIG. 6 may be part of the processor circuit 210.

As illustrated, the circuit is supplied with input signals $f_1$, $f_2$, $f_3$ corresponding to the measured frequency values, and with input signals FT1 and FT3 corresponding to the first input signal value FT1 and the third input signal value FT3 applied to the frequency control input of the oscillator circuit 110 during measurement of the frequency $f_1$ and $f_3$, respectively. The input signal value applied to the frequency control input of the oscillator circuit 110 during measurement of the frequency value $f_2$ is related to the input signal values FT1 and FT3 according to equation (9). In the illustrated example, the input signals $f_1$, $f_2$, $f_3$, FT1, FT3 are supplied to the circuit as digital values and then subjected to digital processing by a number of digital processing elements.

As illustrated in FIG. 6, the digital processing elements comprise a first bit-shifting (BS) element 211, a first summation element 212, a second summation element 213, a third summation element 214, a second bit-shifting element 215, a first multiplication element 216, and a division element 217. The first bit-shifting element 211 receives $f_2$ and accomplishes a bit-shift by one to the left, which implements a multiplication by a factor of two. The first summation element 212 receives $f_3$ at a non-inverting input and $f_1$ at an inverting input and therefore accomplishes a subtraction of $f_1$ from $f_3$. The second summation element receives FT3 at a non-inverting input and FT1 at an inverting input and therefore accomplishes a subtraction of FT1 from FT3. The third summation element 214 receives $f_1$ and $f_3$ at non-inverting inputs and the output signal of the first bit-shifting element 211 at an inverting input and therefore accomplishes a subtraction of the output signal of the first bit-shifting element 211 from the sum of $f_1$ and $f_3$. The output signal of the third summation element 214 is supplied to the second bit-shifting element 215, which accomplishes a bit-shift of one bit to the left, corresponding to a multiplication by a factor of two. The multiplication element 216 receives the output signal of the first summation element 212 and the output signal of the second summation element 213 and accomplishes a multiplication thereof. The division element 217 receives the output signal of the second bit-shifting element 215 at a numerator input and the output signal of the multiplication element 216 at a divisor input. The division element 217 accomplishes a division of the output signal of the second bit-shifting element 215 by the output signal of the multiplication element 216. The output signal of the division element 217 corresponds to the normalized second order polynomial coefficient $a_{2N}$ as defined by equation (16).

Figure 7:
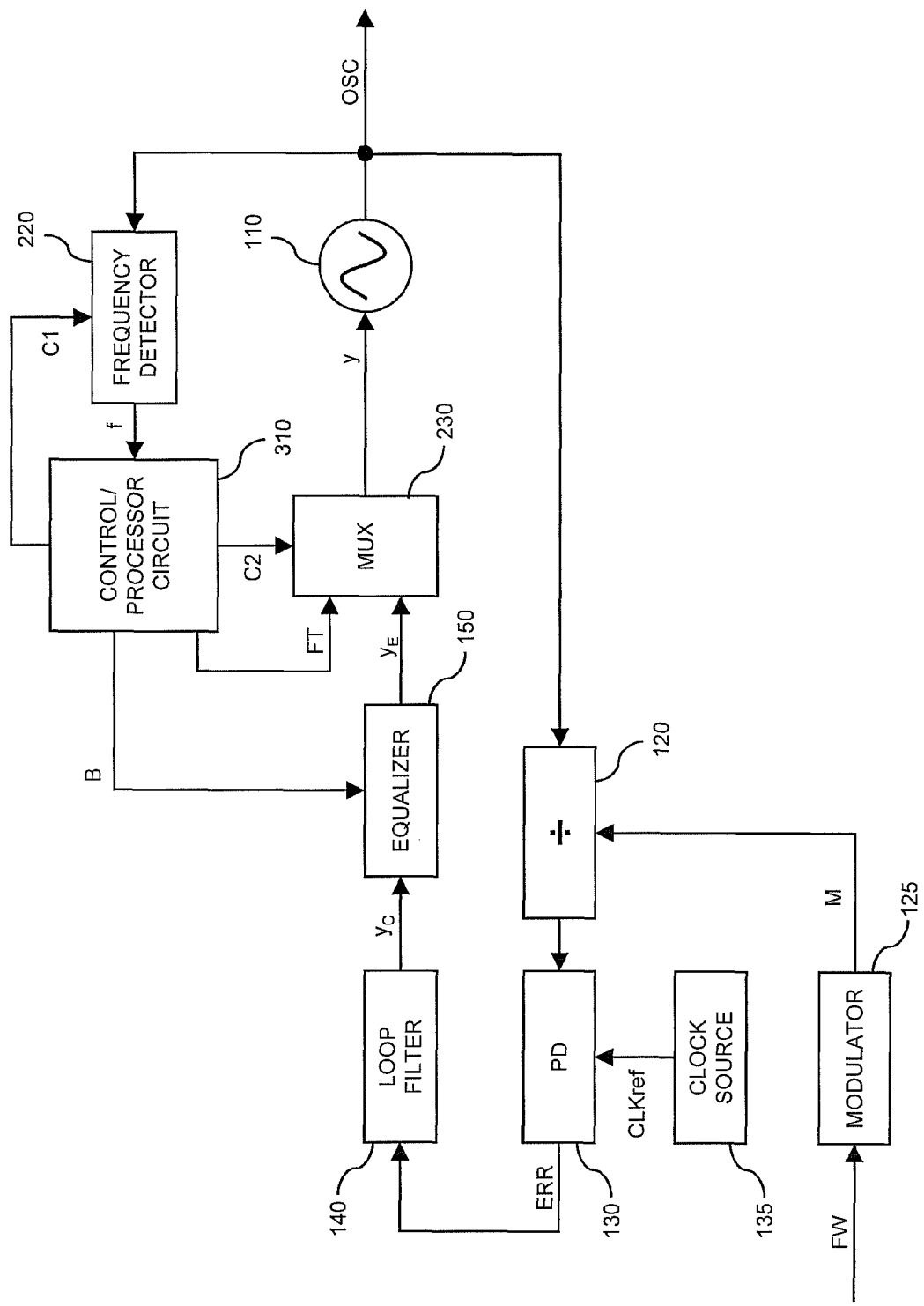
FIG. 7 schematically illustrates a circuit according to a further embodiment of the invention.

FIG. 7 schematically illustrates a circuit according to a further embodiment of the invention. In FIG. 7, components which are similar to those of FIGS. 3, 4, and 5 have been designated by the same reference signs. Details concerning these components can be taken from the corresponding description in connection with FIGS. 3, 4, and 5.

The structure of the circuit of FIG. 7 generally corresponds to that of FIG. 5. However, in this case, a control/processor circuit 310 is provided which is configured to calculate the coefficient $b_2$ in equation (5) on the basis of two frequency measurements. The coefficient $b_2$ is used for setting the nonlinear equalizer characteristic of the equalizer circuit according to equation (5).

For performing the frequency measurements, the processor circuit 310 controls the frequency detector 220 using the control signal C1 and the multiplexer 230 using the control signal C2. Further details concerning the calculation of the coefficient $b_2$ and the needed frequency measurements will be explained in connection with FIGS. 8 to 10.

Figure 8:
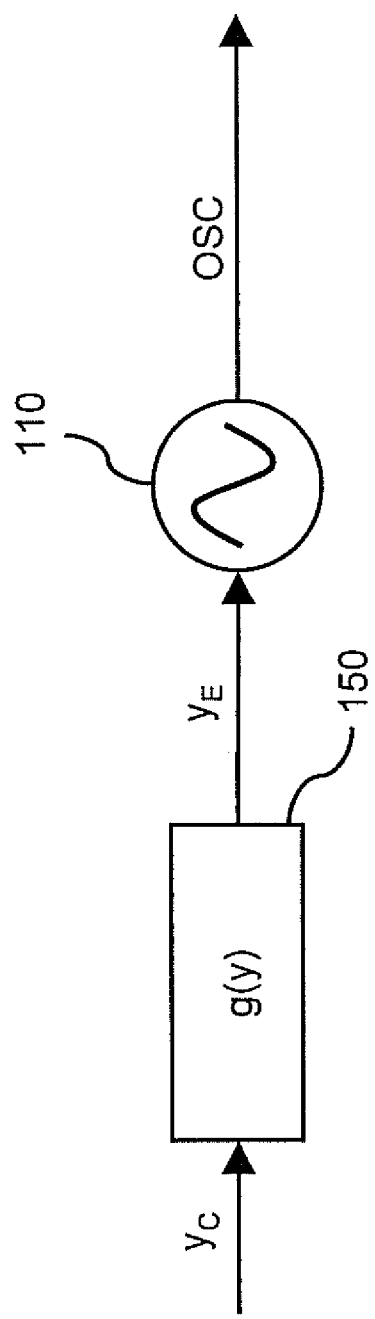
FIG. 8 schematically illustrates a circuit according to a further embodiment of the invention.

FIG. 8 schematically illustrates a circuit according to an embodiment of the invention. As illustrated, the circuit comprises an oscillator circuit 110, which may be similar to the oscillator circuits as explained above. In addition, the circuit comprises an equalizer circuit 150, i.e. similar to the equalizer circuits as illustrated in FIGS. 5 and 7. The equalizer circuit 150 is provided with a nonlinear equalizer characteristic configured to compensate nonlinearities in the oscillator characteristic of the oscillator circuit 110. Accordingly, a linearized oscillator characteristic is obtained which relates values of the frequency control signal $y_c$ to values of the frequency of the oscillator signal OSC. The circuit of FIG. 8 may therefore also be referred to as a linearized oscillator circuit.

The equalizer circuit 150 receives the frequency control signal $y_c$ and generates an equalized frequency control signal $y_E$ according to the nonlinear equalizer characteristic. The equalized frequency control circuit $y_E$ is applied to a frequency control input of the oscillator circuit 110.

As can be seen, the closed-loop mode of the circuit of FIG. 7 implements a linearized oscillator circuit as illustrated in FIG. 8.

In order to compensate nonlinearities of the oscillator characteristic, the equalizer circuit 150 is configured in such a way that it provides an equalizer characteristic or transfer function which approximates the inverted oscillator characteristic:

$$g(y) \approx f^{-1}(y \cdot k), \tag{24}$$

where k denotes a scaling factor applied to the input values of the inverted oscillator characteristic.

By using an equalizer circuit configured to provide an equalizer characteristic in accordance with equation (24), any nonlinear oscillator characteristic may be linearized. However, in some cases implementation of the equalizer circuit 150 may become complex. For example, an oscillator characteristic as given by equation (1) results in a rather complex mathematical expression of the inverted oscillator characteristic.

Accordingly, some embodiments of the present invention use appropriate approximations of the inverted oscillator characteristic. According to some embodiments of the invention, the equalizer circuit 150 may comprise a look-up table which stores values of the frequency control signal $y_c$ and related values of the equalized frequency control signal $y_E$. According to further embodiments of the invention, the equalizer circuit comprises digital processing elements configured to perform mathematical operations on values of the frequency control signal $y_c$ so as to obtain the related values of the equalized frequency control signal $y_E$.

According to an embodiment of the invention, the equalizer characteristic for approximating the inverted oscillator characteristic of equation (1) is given by a second order polynomial:

$$g(y) = b_0 + b_1 y + b_2 (y - N_{VAR}/2)^2. \tag{25}$$

In equation (25), the constant coefficient $b_o$ corresponds to a frequency offset in the linearized oscillator characteristic. If the frequency control signal $y_c$ is generated by a control loop, such as in a PLL, the frequency offset will be compensated by the control loop and may therefore be neglected. The first order polynomial coefficient $b_1$ corresponds to a deviation in the slope of the oscillator characteristic. When generating the frequency control signal by means of a control loop, such a deviation of the slope may be taken into account by suitably setting the loop gain, e.g. a loop filter gain. Accordingly, it may be assumed that $b_1$ is equal to one. Consequently, in some embodiments of the inventions the nonlinear equalizer characteristic is approximated by $$y_E = g(y_C) = y_C + b_2 (y_C - N_{VAR}/2)^2. \tag{26}$$

In equation (26), a quadratic approximation of nonlinearities in the equalizer characteristic is assumed. Simulations show that this assumption provides a reasonable approximation. A correction value to be added to the values of the frequency control signal $y_c$ can therefore be written as $$y_{cor}(y_C) = b_2 (y_C - N_{VAR}/2)^2. \tag{27}$$

Figure 9:
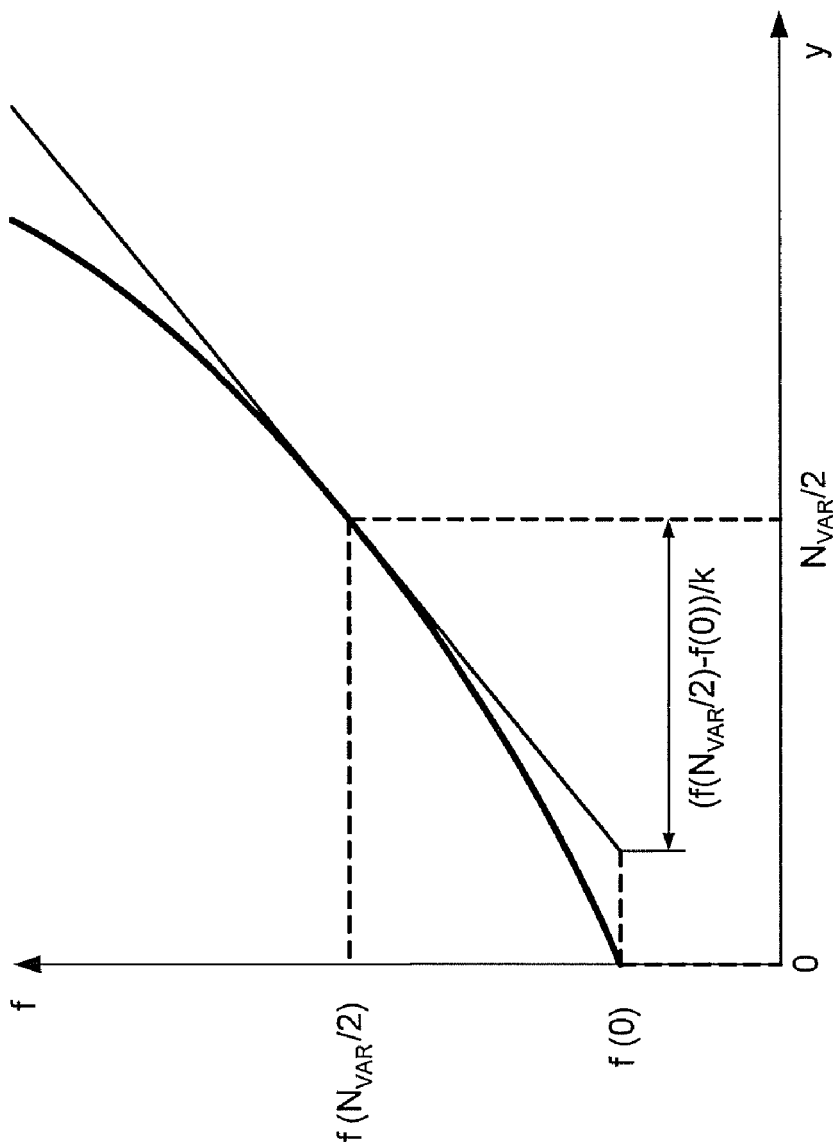
FIG. 9 schematically illustrates frequency measurement points in a nonlinear oscillator characteristic.

FIG. 9 schematically illustrates frequency measurements which may be used to determine the coefficient $b_2$. As illustrated, the coefficient $b_2$ can be determined in an efficient manner by measuring the frequency of the oscillator signal approximately at the center of the tuning range, i.e. at a value of $y = N_{VAR}/2$ and at the lower end of the frequency control range, i.e. at a value of $y = 0$.

As illustrated by FIG. 9, these measured frequency values and equation (27) allow for establishing the following relation:

$$\underbrace{\frac{f(N_{VAR}/2) - f(0)}{k}}_{y_K} - \frac{N_{VAR}}{2} = b_2 \left( \frac{f(N_{VAR}/2) - f(0)}{k} \right)^2. \tag{28}$$

The coefficient $b_2$ may therefore be calculated according to $$b_2 = \frac{1}{y_K} - \frac{N_{VAR}}{2y_K^2}. \quad (29)$$

Here, it is to be noted that the factor k corresponds to an average gain of the oscillator characteristic which may already be known for purposes of setting the loop gain of a control loop for generating the frequency control signal $y_C$. According to an embodiment of the invention, the scaling factor k or the average gain may be estimated on the basis of frequency measurements according to equation (15).

Approximation of the coefficient $b_2$ by a first order Taylor series results in:

$$b_2 \approx \frac{4y_K}{N_{VAR}^2} - \frac{2}{N_{VAR}} = \frac{4(f(N_{VAR}/2) - f(0))}{kN_{VAR}^2} - \frac{2}{N_{VAR}}. \quad (30)$$

Reusing the frequency measurements as described in connection with FIG. 2, i.e. using $f(N_{VAR}/2)=f_2$ and $f(0)=f_1$, and replacing the scaling factor k by $(f_3-f_1)/(FT3-FT1)$, (FT3-FT1) being equal to $N_{VAR}$, yields:

$$\begin{aligned} b_2 &\approx \frac{4(f_2 - f_1)N_{VAR}}{(f_3 - f_1)N_{VAR}^2} - \frac{2}{N_{VAR}} \\ &= -\frac{2(f_3 - 2f_2 + f_1)}{(f_3 - f_1)N_{VAR}} \\ &= \frac{2(f_3 - 2f_2 + f_1)}{(f_1 - f_3)N_{VAR}} \\ &= -a_{2N}, \end{aligned} \quad (31)$$

which shows that the first order approximation of $b_2$ is equal to the negative value of the normalized second order polynomial coefficient $a_{2N}$ calculated according to equation (16).

According to some embodiments, frequency measurements as explained in connection with FIG. 2 may therefore be reused for calculating the coefficient $b_2$ according to equation (29) or (31).

Figure 10:
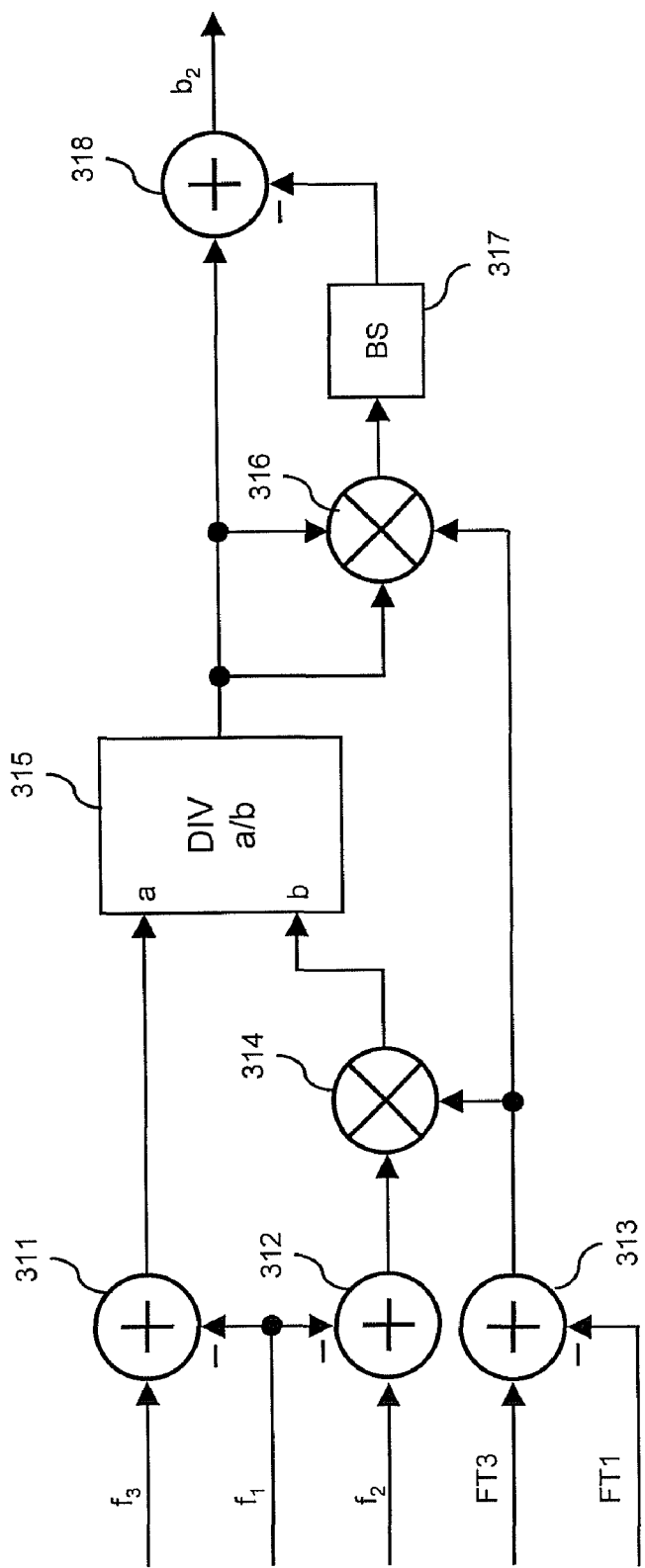
FIG. 10 schematically illustrates a calculation circuit according to a further embodiment of the invention.

FIG. 10 schematically illustrates a circuit for calculating the coefficient $b_2$ according to equation (29). The circuit of FIG. 10 may be part of the processor circuit 310 in FIG. 7. As input signals, the circuit receives the first frequency value $f_1$, the second frequency value $f_2$, and the third frequency value $f_3$ measured when the first input signal value FT1, the second input FT2, and the third input signal value FT3, respectively, are applied to the frequency control input of the oscillator circuit, as explained in connection with FIG. 2. According to the illustrated example, these signals are supplied to the circuit as digital values and the calculation is accomplished by a number of digital processing elements.

As illustrated in FIG. 10, the circuit comprises a first summation element 311, a second summation element 312, a third summation element 313, a first multiplication element 314, a division element 315, a second multiplication element 316, a bit-shifting element 317, and a fourth summation element 318.

The first summation element 311 receives $f_3$ at a non-inverting input and receives $f_1$ at an inverting input. Accordingly, the first summation element 311 accomplishes a subtraction of $f_1$ from $f_3$. The second summation element 312 receives $f_2$ at a non-inverting input and receives $f_1$ at an inverting input. Accordingly, the second summation element 312 accomplishes a subtraction of $f_1$ from $f_2$. The third summation element 313 receives FT3 at a non-inverting input and FT1 at an inverting input. Accordingly, the third summation element accomplishes a subtraction of FT1 from FT3. The first multiplication element 314 receives the output signal of the second summation element 312 and the output signal of the third summation element 313 and accomplishes a multiplication thereof. The division element 315 receives the output signal of the first summation element 311 at a numerator input and the output signal of the first multiplication element 314 at a divisor input. The division element 315 accomplishes a division of the output signal of the first summation element 311 by the output signal of the first multiplication element 314. The output signal of the division element 315 corresponds to the term $1/y_K$ of equation (29). The second multiplication element 316 receives the output signal of the division element 315 both at a first input and at a second input. Additionally, the second multiplication element 316 receives the output signal of the third summation element 313 at a third input. Accordingly, the second multiplication element 316 accomplishes squaring of the output signal of the division element 315, i.e. of $1/y_K$, and multiplication of the squared value with FT3-FT1. The bit shifting element 317 receives the output signal of the second multiplication element 316 and performs a bit shift by one bit to the right, which corresponds to a division by two. The fourth summation element 318 receives the output signal of the division element 315 at a non-inverting input and the output signal of the bit-shifting element 317 at an inverting input. The fourth summation element 318 therefore accomplishes a subtraction of the output signal of the bit-shifting element 317 from the output signal of the division element 315. Accordingly, the output signal of the fourth summation element 318 is the coefficient $b_2$ as given by equation (29).

Figure 11:
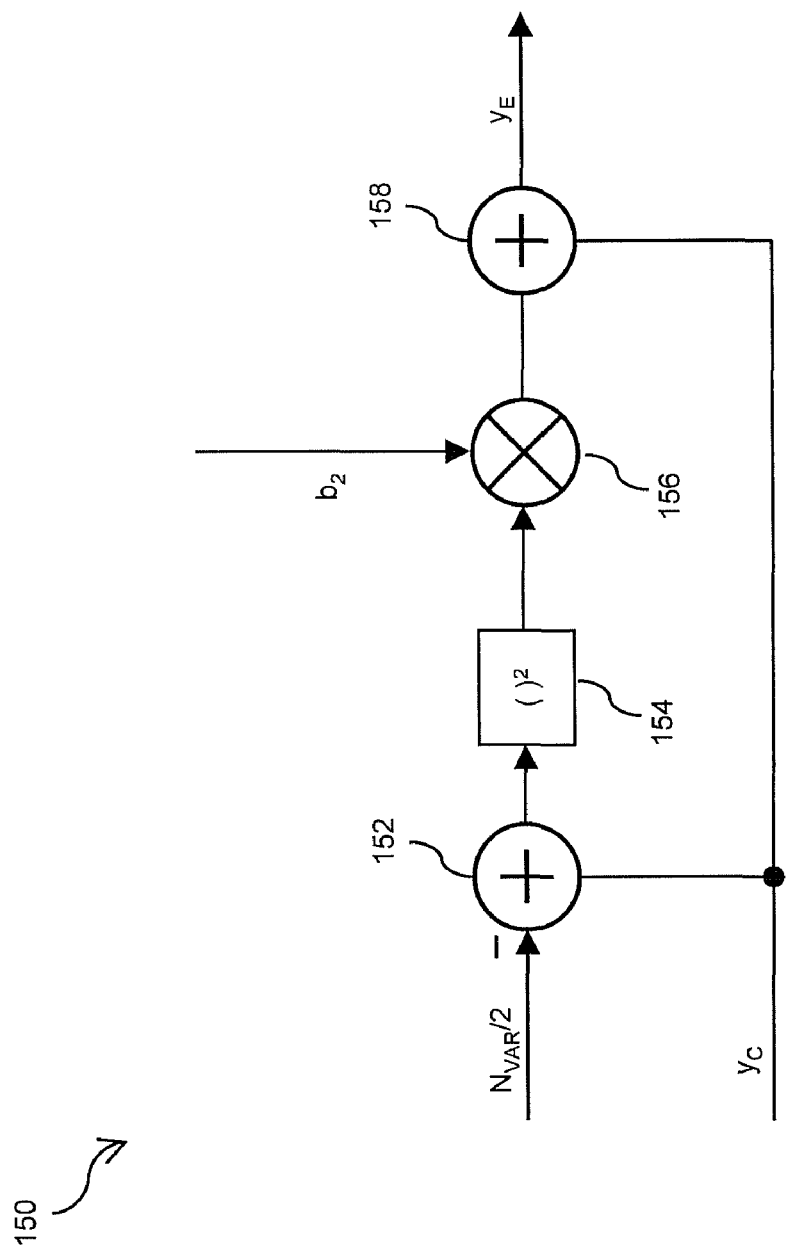
FIG. 11 schematically illustrates an equalizer circuit according to an embodiment of the invention.

FIG. 11 schematically illustrates a circuit according to an embodiment of the invention, which may be used for implementing the equalizer circuit 150 as illustrated in FIG. 7. The circuit receives the frequency control signal $y_c$ as a digital value and accomplishes calculation of the equalized frequency control signal $y_E$ using a number of digital processing elements.

As illustrated, the circuit of FIG. 11 comprises a first summation element 152, a squaring element 154, which may be implemented on the basis of a multiplication element, a multiplication element 156, and a second summation element 158. The first summation element 152 receives the frequency control signal $y_c$ at a non-inverting input. At an inverting input, the first summation element is supplied with an offset value, in the illustrated example $N_{VAR}/2$. The first summation element 152 therefore accomplishes a subtraction of the offset value from the frequency control signal $y_c$. The squaring element 154 receives the output signal of the first summation element 152 and outputs a squared value thereof. The multiplication element 156 receives the squared value and the coefficient $b_2$. The multiplication element 156 accomplishes a multiplication of the squared value of $y_c$ by the coefficient $b_2$. The second summation element 158 receives the output signal of the multiplication element 156 at a first non-inverting input and receives the frequency control signal $y_c$ at a second non-inverting input. The second summation element 158 therefore accomplishes an addition of the frequency control signal $y_c$, corresponding to the first term of equation (26), and of the output signal of the multiplication element 156, corresponding to the second term of equation (26). The output signal of the second summation element 158 is the equalized frequency control signal $y_E$.

In other embodiments, the circuit of FIG. 11 may be implemented in a simplified manner by neglecting the offset term $N_{VAR}/2$. This is possible because the offset term merely results in additional linear and constant contributions in equation (26), which may be otherwise compensated for, e.g. using suitable gain adjustment or due to operation of a control loop for generating the frequency control signal $y_c$. In such a simplified implementation, the first summation element and the second summation element could be omitted.

Figure 12:
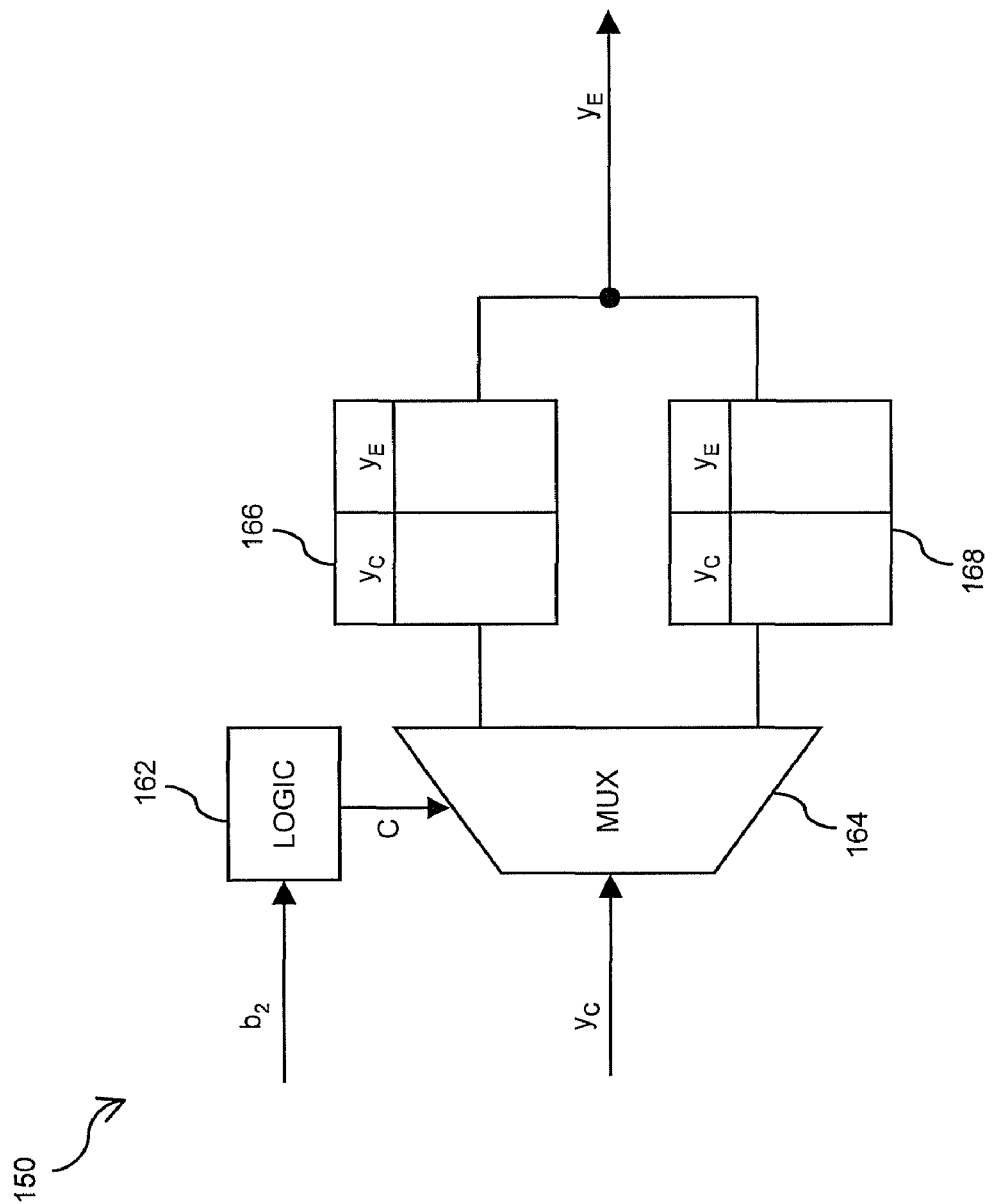
FIG. 12 schematically illustrates an equalizer circuit according to a further embodiment of the invention.

FIG. 12 schematically illustrates a further circuit for implementing the equalizer circuit 150. According to this example, the equalizer circuit is implemented on the basis of a look-up table storing values of the frequency control signal $y_c$ and related values of the equalized frequency control signal $y_E$.

As illustrated, the circuit comprises a logic 162, a multiplexer 164, a first subtable 166 of the look-up table, and a second subtable 168 of the look-up table. The logic receives the coefficient $b_2$ and is configured to evaluate the coefficient $b_2$ so as to generate a control signal C. The evaluation by the logic 162 may comprise a comparison to one or more threshold values. The multiplexer 164 is controlled on the basis of the control signal C so as to selectively supply the frequency control signal $y_c$ to one of the subtables 166, 168. Each of the subtables 166, 168 stores values of the frequency control signal $y_c$ and related values of the equalized frequency control signal $y_E$ in accordance with a corresponding equalizer characteristic. Consequently, by selecting between the different subtables 166, 168, different equalizer characteristics can be selected. Specifically, the equalizer characteristic can be selected in such a way that it best approximates a desired equalizer characteristic as indicated by the coefficient $b_2$. The output signal of the circuit is given by the values of the equalized frequency control signal according $y_E$ to the selected subtable 166,168.

It is to be understood that the circuit of FIG. 12 could be implemented with a larger number of subtables so as to increase the flexibility in setting the equalizer characteristic. In addition, it is to be understood that the equalizer circuit 150 of FIG. 5 can be implemented in a similar manner, e.g. by taking into account that the coefficient $b_2$ is equal to the negative value of the coefficient $a_{2N}$.

Figure 13:
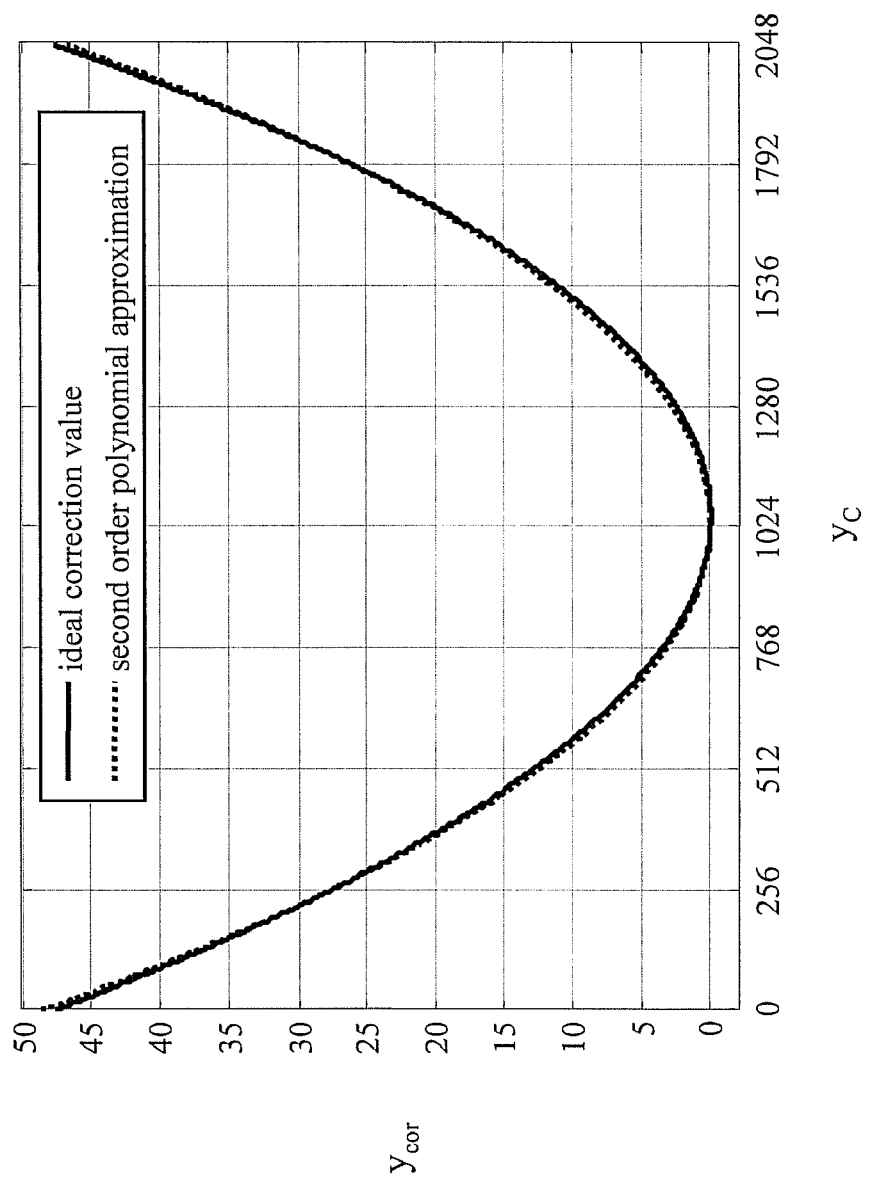
FIG. 13 shows exemplary simulation results representing a correction value in a method of compensating nonlinearities according to an embodiment of the invention.

FIG. 13 shows simulation results which compare the ideal correction value for obtaining a linearized oscillator characteristic by means of equalization to the correction value obtained according to a second order polynomial approximation as given by equation (27). As can be seen, the second order polynomial approximation is reasonable.

Figure 14:
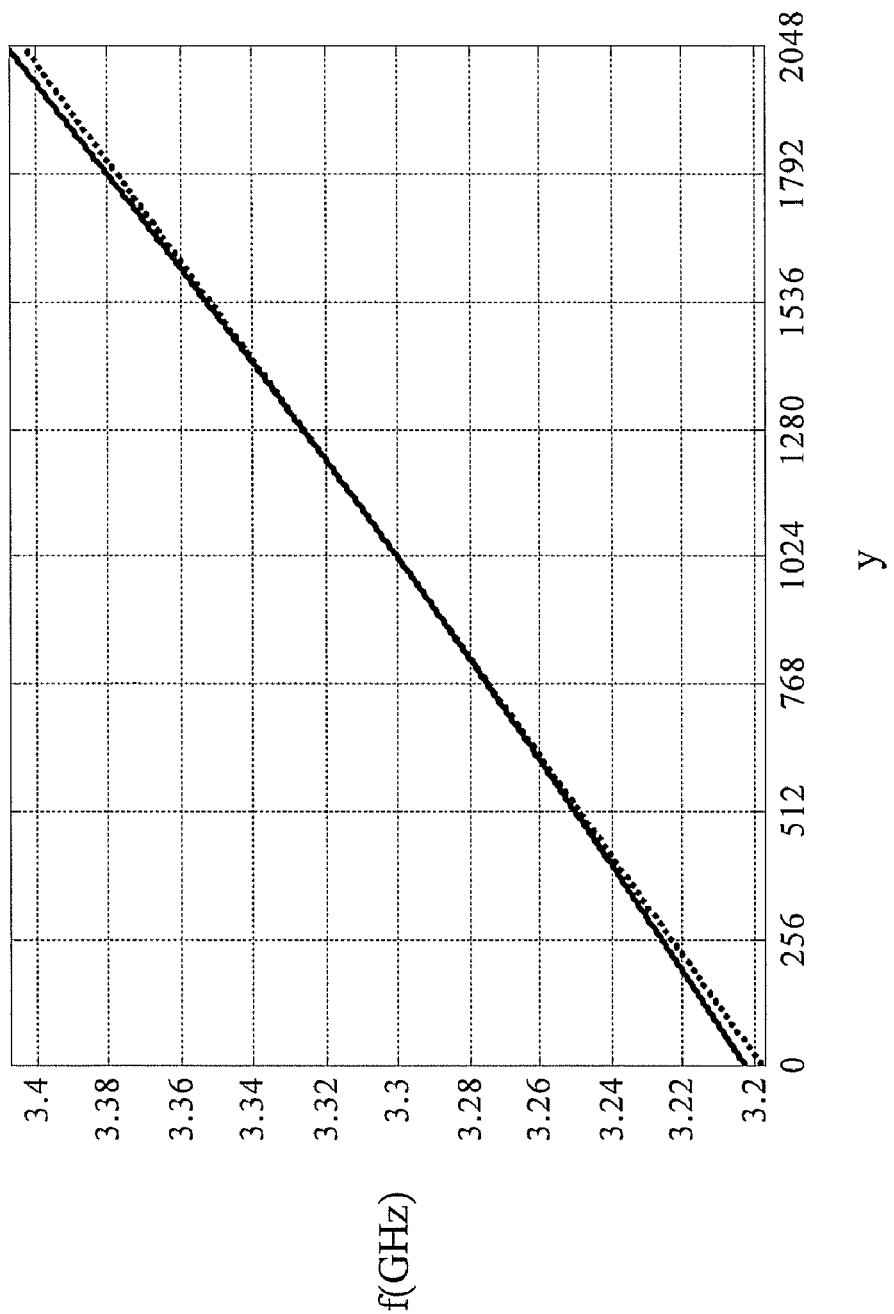
FIG. 14 shows exemplary simulation results comparing a nonlinear oscillator characteristic to an ideal linear oscillator characteristic.
Figure 15:
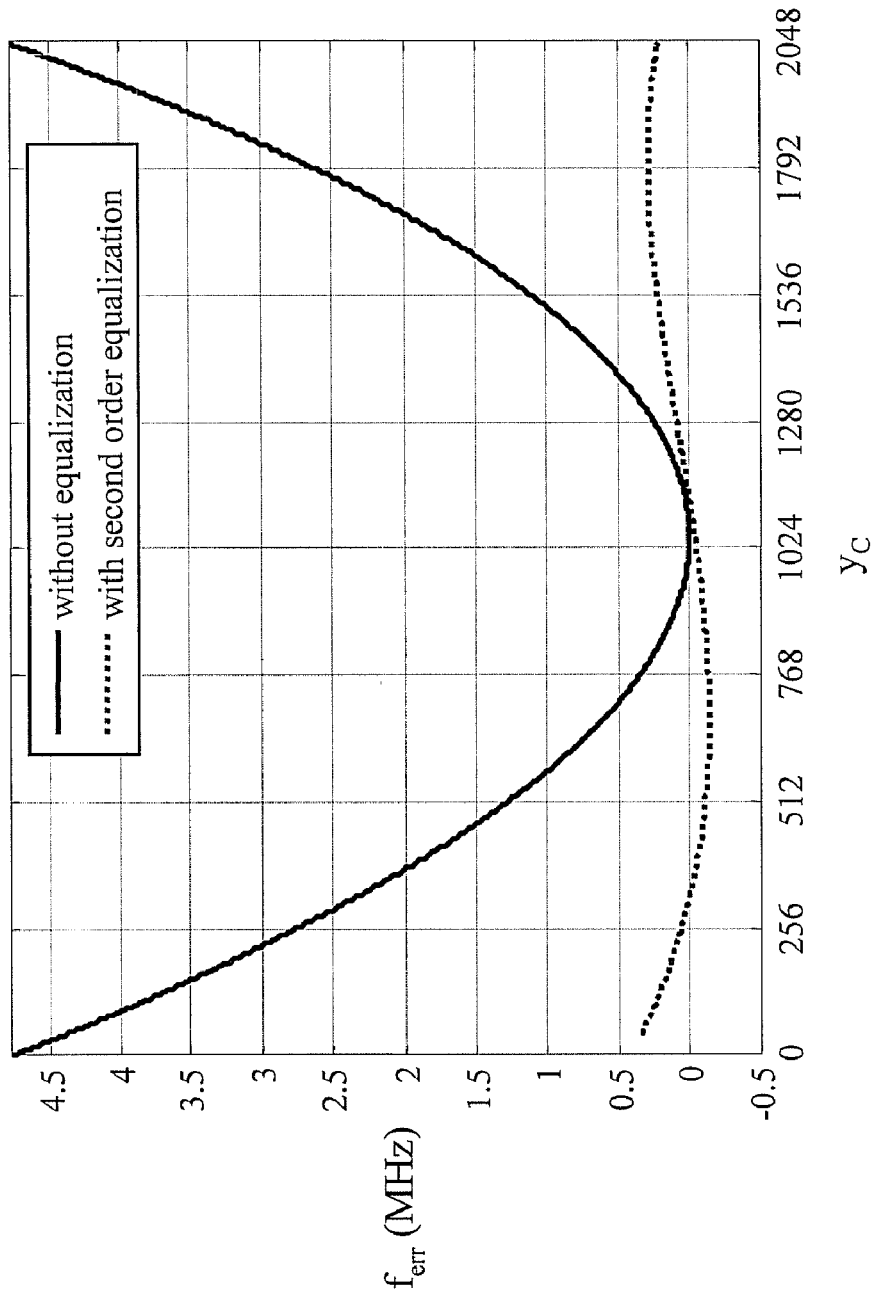
FIG. 15 shows exemplary simulation results comparing a frequency error without equalization to a frequency error with equalization according to an embodiment of the invention.

FIG. 14 illustrates simulation results comparing the nonlinearized oscillator characteristic (shown by a solid line) to the linearized oscillator characteristic (shown by a dotted line). FIG. 15 shows simulation results comparing the deviation of the nonlinearized oscillator characteristic from the ideal linear oscillator characteristic (solid line) and the deviation of the linearized oscillator characteristic from the ideal linear oscillator characteristic (dotted line). As can be seen from FIG. 14, the above-described linearization of the oscillator characteristic allows for significantly reducing the nonlinearities caused by the oscillator characteristic as given in equation (1). In an exemplary digitally controlled oscillator using a digital frequency control signal having 11 bits, the deviation can be reduced from a value corresponding to 50 times the least significant bit (LSB) of the frequency control signal to a value corresponding to about three times the LSB of the frequency control signal.

Figure 16:
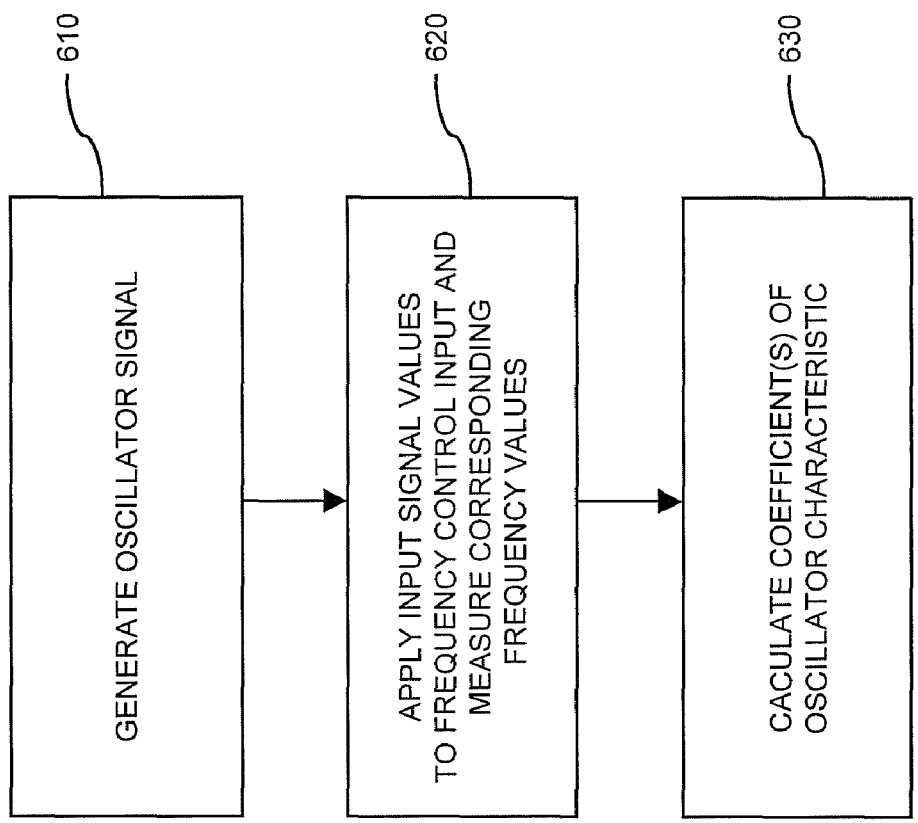
FIG. 16 shows a flow chart for illustrating a method according to an embodiment of the invention.

FIG. 16 shows a flowchart for schematically illustrating a method according to an embodiment of the invention. The method may be used to estimate the oscillator characteristic on the basis of frequency measurements as explained above.

In step 610, an oscillator signal is generated by an oscillator circuit having a frequency control input. The frequency of the oscillator signal depends on an input signal applied to a frequency control input. Values of the input signal are related to values of the frequency by an oscillator characteristic.

In step 620, different input signal values are applied to the frequency control input and corresponding frequency values are measured. For example, a first frequency value may be measured when a first input signal value is applied to the frequency control input, a second frequency value may be measured when a second input signal value is applied to the frequency control input, and a third frequency value may be measured when a third input signal value is applied to the frequency control input. According to some embodiments of the invention, further frequency measurements may be carried out. For example, a fourth frequency value may be measured when the fourth input signal value is applied to the frequency control input.

At step 630, at least a second order polynomial coefficient of the oscillator characteristic is calculated on the basis of the input signal values and the measured corresponding frequency values, e.g. according to equation (14). The second order polynomial coefficient of the oscillator characteristic may also be calculated as a normalized coefficient, e.g. according to equation (16) or (23). In addition, also a first order polynomial coefficient of the oscillator characteristic and/or higher order polynomial coefficients, e.g. a third order polynomial coefficient, may be calculated. According to an embodiment of the invention, a first order polynomial coefficient may be calculated according to equation (15) and a third order polynomial coefficient may be calculated according to equation (21).

Figure 17:
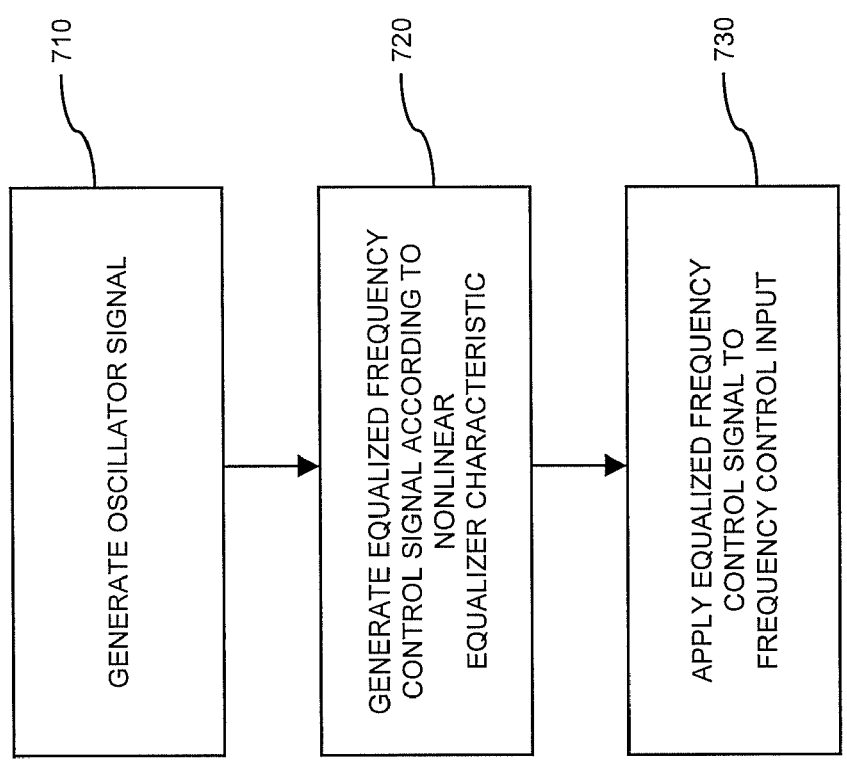
FIG. 17 shows a flow chart for illustrating a method according to a further embodiment of the invention.

FIG. 17 schematically illustrates a flowchart for illustrating a further method according to an embodiment of the invention. The method may be used to compensate nonlinearities of an oscillator characteristic by means of equalization as explained above.

In step 710, an oscillator signal is generated by means of an oscillator circuit having a frequency control input. A frequency of the oscillator signal depends on an input signal applied to a frequency control input. Values of the input signal are related to values of the frequency by an oscillator characteristic.

At step 720, an equalized frequency control signal is generated according to a nonlinear equalizer characteristic. The nonlinear equalizer characteristic relates values of a frequency control signal to values of the equalized control signal. The frequency control signal may be generated by a control loop, e.g. in a PLL. The equalizer characteristic is determined so as to compensate nonlinearities of the oscillator characteristic.

In step 730, the equalized frequency control signal is applied to the frequency control input of the oscillator circuit, thereby compensating nonlinearities of the oscillator circuit.

It is to be understood that the methods as illustrated by FIGS. 16 and 17 may also be combined with each other. For example, the nonlinear equalizer characteristic as used in the method of FIG. 17 may be determined on the basis of the oscillator characteristic as estimated according to the method of FIG. 16. Also, it is to be understood that according to some embodiments of the invention the method steps as illustrated in FIG. 16 or 17 may be arranged in a different order. Further, in some embodiments of the invention one or more of the illustrated method steps may be modified or even omitted.

It is to be understood that the above-described embodiments and examples have been provided only for the purpose of illustrating the present invention. As will be apparent to the skilled person, the invention may be applied in a variety of different ways, which may deviate from the above-described embodiments. For example, the concepts as described above are not limited to be applied in a digital PLL, but may also be applied in other application environments using frequency-controlled oscillator circuits.

What is claimed is:

1. A device, comprising:
   an oscillator circuit comprising a frequency control input and configured to output an oscillator signal, a frequency of the oscillator signal depending on an input signal applied to the frequency control input;
   a control circuit configured to apply a first input signal value, a second input signal value, and a third input signal value to the frequency control input;
   a frequency detector circuit configured to detect a first frequency value of the oscillator signal when the first input signal value is applied to the frequency control input, a second frequency value of the oscillator signal when the second input signal value is applied to the frequency control input, and a third frequency value of the oscillator signal when the third input signal value is applied to the frequency control input; and
   a processor circuit configured to calculate, on the basis of the first input signal value, the second input signal value, the third input signal value, the first frequency value, the second frequency value, and the third frequency value, a second order coefficient of a polynomial oscillator characteristic relating values of the frequency of the oscillator signal to values of the input signal.

2. The device according to claim 1, wherein the processor circuit is configured to calculate the second order coefficient on the basis of a single division operation.

3. The device according to claim 1, wherein the control circuit is configured to apply n+1 different input signal values to the frequency control input, n being an integer >0,
   wherein the frequency detector is configured to detect n+1 frequency values of the oscillator signal, each of the frequency values corresponding to a respective one of the input signal values applied to the frequency control input; and
   wherein the processor circuit is configured to calculate, on the basis of the n+1 input signal values and the corresponding frequency values, an n-th order coefficient of the oscillator characteristic.

4. The device according to claim 1, wherein the input signal is a digital signal.

5. The device according to claim 1, wherein the frequency detector comprises a counter.

6. The device according to claim 1, comprising: an equalizer circuit configured to receive a frequency control signal and to output an equalized frequency control signal, the equalizer circuit being provided with an equalizer characteristic relating values of the frequency control signal to values of the equalized frequency control signal, the equalizer characteristic being set on the basis of the calculated second order coefficient of the oscillator characteristic.

7. The device according to claim 6, wherein the equalizer characteristic is a polynomial equalizer characteristic having a second order coefficient equal to the negative value of the calculated second order coefficient of the oscillator characteristic.

8. The device according to claim 6, wherein the equalizer circuit comprises a look-up table configured to store, according to the equalizer characteristic, values of the frequency control signal and related values of the equalized frequency control signal.

9. The device according to claim 6, wherein the equalizer circuit comprises a calculator circuit configured to perform at least one mathematical operation on values of the frequency control signal.

10. The device according to claim 9, wherein the at least one mathematical operation comprises a squaring operation, an addition operation, and/or a multiplication operation.

11. The device according to claim 1, comprising: a control loop configured to generate a frequency control signal on the basis of the oscillator signal.

12. The device according to claim 11, wherein the control loop comprises a loop filter, a loop filter gain being set on the basis of the calculated second order coefficient.

13. A device, comprising:
    an equalizer circuit configured to receive a frequency control signal and to output an equalized frequency control signal; and
    an oscillator circuit comprising a frequency control input and configured to output an oscillator signal, a frequency of the oscillator signal depending on an input signal applied to the frequency control input,
    wherein the frequency control input of the oscillator circuit is coupled to the equalizer circuit so as to receive the equalized frequency control signal, and wherein the equalizer circuit is provided with a nonlinear equalizer characteristic relating values of the frequency control signal to values of the equalized frequency control signal, the equalizer characteristic being configured to compensate nonlinearities of an oscillator characteristic relating values of the frequency of the oscillator signal to values of the input signal, and wherein the equalizer circuit comprises a look-up table configured to store, according to the equalizer characteristic, the values of the frequency control signal and the related values of the equalized frequency control signal.

14. The device according to claim 13, wherein the equalizer circuit comprises a calculator circuit configured to perform at least one mathematical operation on the values of the frequency control signal.

15. The device according to claim 14, wherein the at least one mathematical operation comprises a squaring operation, an addition operation and/or a multiplication operation.

16. The device according to claim 13, comprising:
    a control circuit configured to apply a first input signal value and a second input signal value to the frequency control input;
    a frequency detector circuit configured to detect a first frequency value of the oscillator signal when the first input signal value is applied to the frequency control input and a second frequency value of the oscillator signal when the second input signal value is applied to the frequency control input; and
    a processor circuit configured to calculate, on the basis of the first input signal value, the second input signal value, the first frequency value, and the second frequency value, a second order polynomial coefficient of the equalizer characteristic.

17. The device according to claim 13, comprising: a control loop configured to generate the frequency control signal on the basis of the oscillator signal.

18. A method, comprising:
    generating an oscillator signal, the frequency of the oscillator signal depending on an input signal applied to a frequency control input of an oscillator circuit;

applying a first value of the input signal to the frequency control input and detecting a first frequency value of the oscillator signal;

applying a second value of the input signal to the frequency control input and detecting a second frequency value of the oscillator signal;

applying a third value of the input signal to the frequency control input and detecting a third frequency value of the oscillator signal; and calculating, on the basis of the first value of the input signal, the second value of the input signal, the third value of the input signal, the first frequency value, the second frequency value, and the third frequency value, a second order coefficient of a polynomial oscillator characteristic relating values of the frequency of the oscillator signal to values of the input signal.

19. The method according to claim 18, comprising:
calculating the second order coefficient on the basis of a division operation.

20. The method according to claim 18, comprising:
determining, on the basis of the calculated second order coefficient of the oscillator characteristic, an equalizer characteristic relating values of a frequency control signal to values of an equalized frequency control signal;

generating, according to the equalizer characteristic, the equalized frequency control signal from the frequency control signal; and applying the equalized frequency control signal to the frequency control input.

21. The method according to claim 20, comprising:
wherein the equalizer characteristic is a polynomial equalizer characteristic having a second order coefficient equal to the negative value of the calculated second order coefficient of the oscillator characteristic.

22. The method according to claim 20, comprising:
generating the frequency control signal on the basis of the oscillator signal.

* * * * *